United States Patent
Lin et al.

(10) Patent No.: US 9,542,278 B2
(45) Date of Patent: Jan. 10, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW);
Chia-Chi Liang, Taichung (TW);
Chang-Chieh Huang, Zhubei (TW);
Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 141 days.

(21) Appl. No.: 14/534,686

(22) Filed: Nov. 6, 2014

(65) Prior Publication Data

US 2015/0186264 A1    Jul. 2, 2015

Related U.S. Application Data

(60) Provisional application No. 61/920,830, filed on Dec. 26, 2013.

(51) Int. Cl.
*G06F 11/14* (2006.01)
*G06F 12/12* (2016.01)
(Continued)

(52) U.S. Cl.
CPC ....... *G06F 11/1469* (2013.01); *G06F 11/1072* (2013.01); *G06F 12/0246* (2013.01);
(Continued)

(58) Field of Classification Search
CPC .......... G06F 11/1469; G06F 12/121; G06F 11/1072; G06F 12/0246; G06F 2212/1032; G06F 2212/7202; G06F 2212/7203; G06F 2212/69; G06F 2212/7209; G06F 2212/7201; G11C 29/52; G11C 2029/0411; Y02B 60/1225

See application file for complete search history.

(56) References Cited

U.S. PATENT DOCUMENTS 6,895,490 B1 * 5/2005 Moore .................. G06F 3/0607
365/230.03
6,970,890 B1   11/2005 Bruce et al.
(Continued)

FOREIGN PATENT DOCUMENTS

TW    201142589    12/2011
TW    201305817    2/2013
(Continued)

OTHER PUBLICATIONS

Office Action dated Jun. 21, 2016, issued in U.S. Appl. No. 14/534,535.
(Continued)

*Primary Examiner* — David X Yi
*Assistant Examiner* — Rocio Del Mar Perez-Velez
(74) *Attorney, Agent, or Firm* — McClure, Qualey & Rodack, LLP

(57) ABSTRACT

A data storage device and a flash memory control method with high efficiency are disclosed. The random access memory of the data storage device is allocated to provide a collection and update area for logical-to-physical address mapping tables that correspond to logical addresses recorded into the physical-to-logical address mapping table. When recording a logical address corresponding to a new logical-to-physical address mapping table that has not appeared in the collection and update area into the physical-to-logical address mapping table, the microcontroller of the data storage device is configured to collect the new logical-to-physical address mapping table into the collection and update area and perform an update of the new logical-to-
(Continued)

physical address mapping table within the collection and update area.

14 Claims, 4 Drawing Sheets

(51) Int. Cl.
*G06F 12/02* (2006.01)
*G06F 11/10* (2006.01)
*G11C 29/52* (2006.01)
*G11C 29/04* (2006.01)

(52) U.S. Cl.
CPC ............ *G06F 12/121* (2013.01); *G11C 29/52* (2013.01); *G06F 2212/1032* (2013.01); *G06F 2212/69* (2013.01); *G06F 2212/7201* (2013.01); *G06F 2212/7202* (2013.01); *G06F 2212/7203* (2013.01); *G06F 2212/7209* (2013.01); *G11C 2029/0411* (2013.01); *Y02B 60/1225* (2013.01)

(56) References Cited

U.S. PATENT DOCUMENTS

| | | |
|---|---|---|
| 6,988,175 B2 | 1/2006 | Lasser |
| 7,603,525 B2 | 10/2009 | Lasser |
| 7,886,108 B2 | 2/2011 | Lee et al. |
| 7,904,635 B2 | 3/2011 | Deng et al. |
| 8,078,794 B2 | 12/2011 | Lee et al. |
| 8,352,706 B2 | 1/2013 | Yano et al. |
| 8,688,894 B2 | 4/2014 | Kuehne |
| 9,311,006 B2 | 4/2016 | Moshayedi |
| 9,355,028 B2 | 5/2016 | Cheng |
| 2003/0163630 A1 | 8/2003 | Aasheim et al. |
| 2004/0221130 A1* | 11/2004 | Lai ............... G06F 12/0292 711/203 |
| 2004/0268063 A1 | 12/2004 | Lasser |
| 2006/0282644 A1 | 12/2006 | Wong |
| 2007/0021963 A1 | 1/2007 | Deng et al. |
| 2008/0104309 A1 | 5/2008 | Cheon et al. |
| 2008/0126680 A1 | 5/2008 | Lee et al. |
| 2008/0215800 A1 | 9/2008 | Lee et al. |
| 2009/0144501 A2 | 6/2009 | Yim et al. |
| 2009/0172262 A1 | 7/2009 | Olbrich et al. |
| 2009/0240871 A1 | 9/2009 | Yano et al. |
| 2009/0240873 A1 | 9/2009 | Yu et al. |
| 2009/0327589 A1 | 12/2009 | Moshayedi |
| 2009/0327591 A1 | 12/2009 | Moshayedi |
| 2009/0327840 A1 | 12/2009 | Moshayedi |
| 2010/0082883 A1 | 4/2010 | Chen et al. |
| 2010/0169551 A1* | 7/2010 | Yano ............... G06F 12/0246 711/103 |
| 2010/0174851 A1 | 7/2010 | Leibowitz et al. |
| 2010/0306451 A1 | 12/2010 | Johnson |
| 2011/0055458 A1 | 3/2011 | Kuehne |
| 2011/0289255 A1 | 11/2011 | Wang et al. |
| 2012/0239862 A1 | 9/2012 | Seo et al. |
| 2012/0297121 A1 | 11/2012 | Gorobets et al. |
| 2012/0311245 A1 | 12/2012 | Yano et al. |
| 2013/0304975 A1 | 11/2013 | Wang et al. |
| 2013/0326120 A1 | 12/2013 | Cheng |
| 2013/0326169 A1 | 12/2013 | Shaharabany et al. |
| 2014/0006898 A1 | 1/2014 | Sharon et al. |
| 2014/0052898 A1* | 2/2014 | Nan ............... G06F 12/0246 711/103 |
| 2014/0101369 A1* | 4/2014 | Tomlin ............ G06F 12/0246 711/103 |
| 2014/0122776 A1 | 5/2014 | El Maghraoui et al. |
| 2014/0136753 A1 | 5/2014 | Tomlin et al. |
| 2015/0261444 A1 | 9/2015 | Yoshii et al. |

FOREIGN PATENT DOCUMENTS

| | | |
|---|---|---|
| TW | 201348958 | 12/2013 |
| TW | 201348959 | 12/2013 |

OTHER PUBLICATIONS

Office Action dated Jun. 21, 2016, issued in U.S. Appl. No. 14/534,633.
Office Action dated Jul. 1, 2016, issued in U.S. Appl. No. 14/534,603.
Non-Final Office Action mailed Apr. 18, 2016, issued in U.S. Appl. No. 14/534,488.

\* cited by examiner

DATA STORAGE DEVICE AND FLASH MEMORY CONTROL METHOD

CROSS REFERENCE TO RELATED APPLICATIONS

This application claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (e.g. eMMC).

A flash memory device provides storage space which is divided into blocks, and each block includes a plurality of pages. An erase operation designed for flash memory is performed on a block-by-block basis, to release space one block at a time. When updating data, the new data is written into a spare space rather than being overwritten on old data. To manage the flash memory, the mapping information between the host side and the flash memory has to be maintained. It is more complex to manage flash memory rather than other conventional storage mediums. It can be very tricky to manage mapping information for a flash memory.

BRIEF SUMMARY OF THE INVENTION

A data storage device with flash memory and a flash memory control method with high efficiency are disclosed.

A data storage device in accordance with an exemplary embodiment of the disclosure comprises a flash memory and a control unit. The flash memory provides a storage space that is divided into a plurality of blocks with each block comprising a plurality of physical pages. The control unit couples the flash memory to a host and comprises a microcontroller and a random access memory. The microcontroller is configured to build a physical-to-logical address mapping table in the random access memory for a run-time write block between the blocks of the flash memory. The microcontroller is further configured to allocate the random access memory to provide a collection and update area for logical-to-physical address mapping tables that correspond to logical addresses recorded into the physical-to-logical address mapping table. When recording a logical address corresponding to a new logical-to-physical address mapping table that has not appeared in the collection and update area into the physical-to-logical address mapping table, the microcontroller is configured to collect the new logical-to-physical address mapping table into the collection and update area and perform an update of the new logical-to-physical address mapping table within the collection and update area. When recording a logical address corresponding to an old logical-to-physical address mapping table that has appeared in the collection and update area into the physical-to-logical address mapping table, the microcontroller may be configured to perform an update of the old logical-to-physical address mapping table within the collection and update area. The microcontroller may be configured to update a logical-to-physical address mapping relationship recorded in the flash memory in accordance with the logical-to-physical address mapping tables collected and updated in the collection and update area.

A flash memory control method in accordance with an exemplary embodiment of the disclosure comprises the following steps: providing a random access memory for a flash memory, the flash memory providing a storage space that is divided into a plurality of blocks with each block comprising a plurality of pages; building a physical-to-logical address mapping table in the random access memory for a run-time write block between the blocks of the flash memory; and allocating the random access memory to provide a collection and update area for logical-to-physical address mapping tables that correspond to logical addresses recorded in the physical-to-logical address mapping table. When recording a logical address corresponding to a new logical-to-physical address mapping table that has not appeared in the collection and update area into the physical-to-logical address mapping table, the new logical-to-physical address mapping table is collected into the collection and update area and an update of the new logical-to-physical address mapping table is performed within the collection and update area. When recording a logical address corresponding to an old logical-to-physical address mapping table that has appeared in the collection and update area into the physical-to-logical address mapping table, an update of the old logical-to-physical address mapping table may be performed within the collection and update area. A logical-to-physical address mapping relationship recorded in the flash memory may be updated in accordance with the logical-to-physical address mapping tables collected and updated in the collection and update area.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
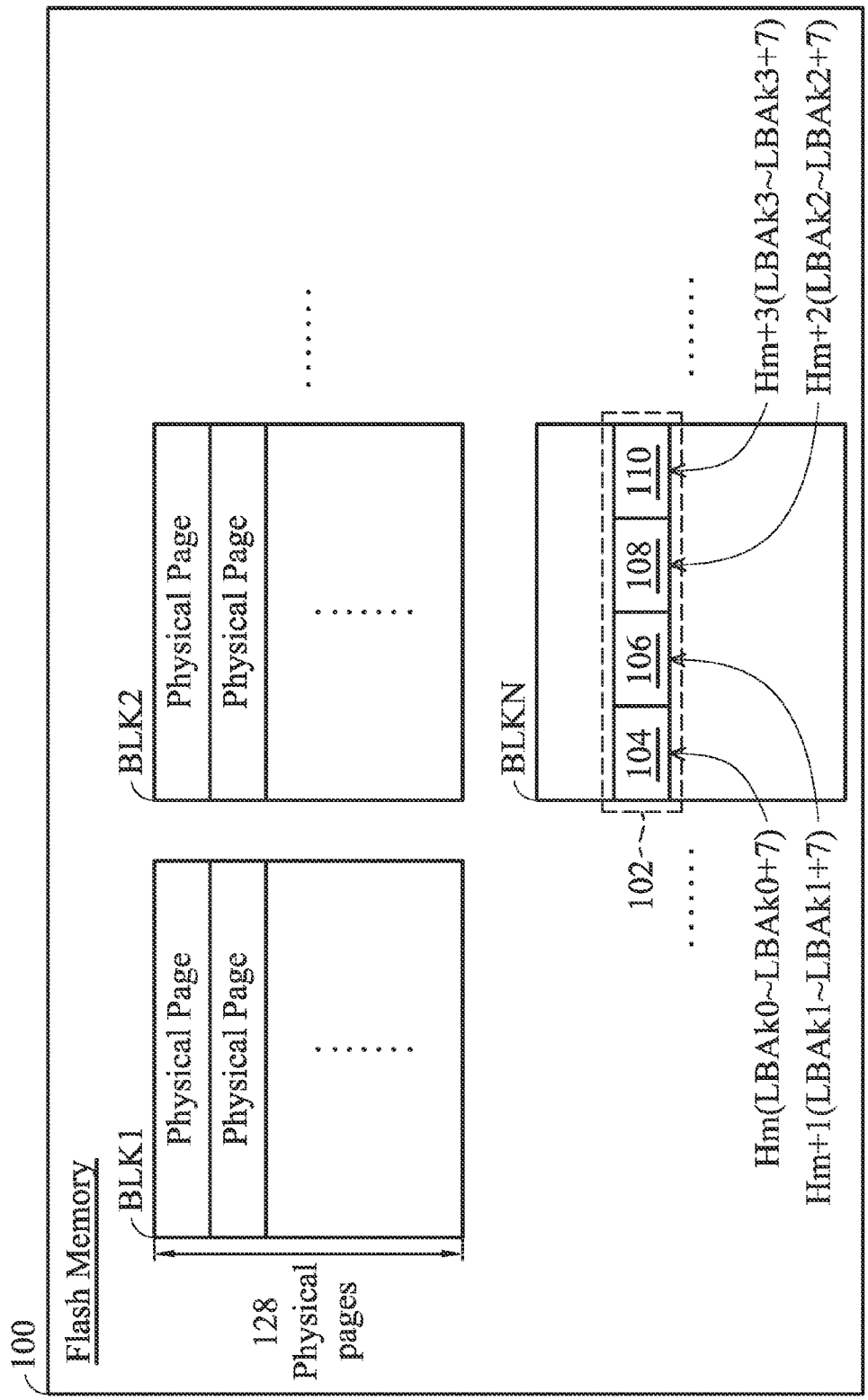
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of physical pages. Each physical page includes a plurality of sectors. For example, physical page 102 provided within block BLKN includes four sectors 104, 106, 108 and 110.

When each sector is allocated for the storage of the user data of one host page (corresponding to a series of logical addresses, e.g. LBAk to LBAk+7), each physical page stores four host pages. For example, the four sectors 104, 106, 108 and 110 correspond to four host pages Hm (i.e. from LBAk0 to LBAk0+7), Hm+1 (i.e. from LBAk1 to LBAk1+7), Hm+2 (i.e. from LBAk2 to LBAk2+7) and Hm+3 (i.e. from LBAk3 to LBAk3+7), respectively. When one block contains 128 physical pages, there are 128×4 host pages corresponding to the 128×4 sectors of the block. For each block, the mapping information between the 128×4 sectors and the 128×4 host pages has to be recorded for storage space management. It is a considerable quantity.

Figure 2:
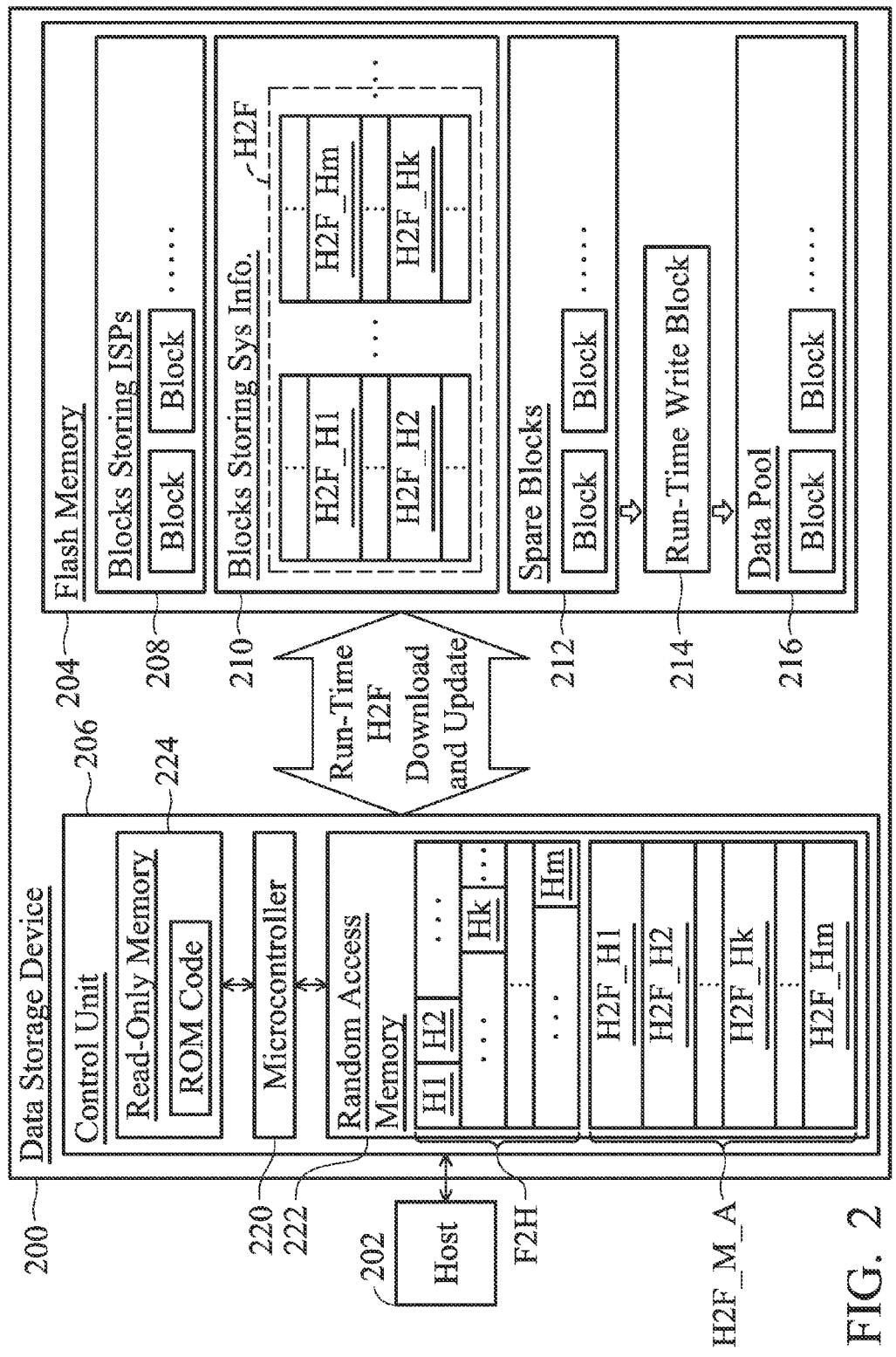
FIG. 2 is a block diagram depicting a data storage device 200 in accordance with an exemplary embodiment of the disclosure.

FIG. 2 is a block diagram depicting a data storage device 200 in accordance with an exemplary embodiment of the disclosure. The data storage device 200, operating in accordance with commands from the host 202, includes a flash memory 204 and a control unit 206. In the flash memory 204, the blocks are allocated for several purposes. Blocks 208 are stored with in-system programs (ISPs). Blocks 210 contain system information, including a logical-to-physical address mapping relationship H2F. Blocks 212 are spare blocks. A run-time write block 214, allocated from the spare blocks, is for reception of write data and will be pushed into the data pool 216 as a data block. The flash memory 204 may further contain free blocks not shown in the figure.

The control unit 206 couples the flash memory 204 to the host 202 and comprises a microcontroller 220, a random access memory 222 and a read-only memory 224. A ROM code is stored in the read-only memory 224. The microcontroller 220 operates the flash memory 204 by executing the ROM code stored in the read-only memory 224 or/and by executing the ISPs stored in the blocks 208 of the flash memory 204. The microcontroller 220 is configured to perform the block allocation of the flash memory 204 (as shown in FIG. 2) and establish a physical-to-logical address mapping table F2H in the random access memory 222 and provide the logical-to-physical address mapping relationship H2F within the flash memory 204. The physical-to-logical address mapping table F2H is established in the random access memory 222 to dynamically record logical addresses corresponding to physical addresses of the run-time write block 214. As shown, there are host pages H1, H2 . . . Hk . . . Hm corresponding to the sectors of the run-time write block 214 in order. The logical-to-physical address mapping relationship H2F showing the mapping between the host 202 addresses (i.e. logical addresses) and the flash memory 204 addresses is recorded in the flash memory 204 for non-volatile storage. The logical-to-physical address mapping relationship H2F may be presented by a plurality of logical-to-physical address mapping tables. As shown, the logical-to-physical address mapping tables H2F_H1, H2F_H2 . . . H2F_Hk . . . H2F_Hm corresponding to the host pages H1, H2 . . . Hk . . . Hm can be found from the logical-to-physical address mapping relationship H2F. Each logical-to-physical address mapping table may contain mapping information about a sequence of logical addresses.

In addition to building the physical-to-logical address mapping table F2H in the random access memory 222 for the run-time write block 214, the microcontroller 220 is further configured to allocate the random access memory 222 to provide a collection and update area H2F_M_A for the logical-to-physical address mapping tables H2F_H1, H2F_H2 . . . H2F_Hk . . . H2F_Hm that correspond to the logical addresses H1, H2 . . . Hk . . . Hm recorded in the physical-to-logical address mapping table F2H. A run-time H2F download and update is performed. When recording a logical address corresponding to a new logical-to-physical address mapping table that has not appeared in the collection and update area H2F_M_A into the physical-to-logical address mapping table F2H, the microcontroller 220 is configured to obtain the new logical-to-physical address mapping table from the logical-to-physical address mapping relationship H2F of the flash memory 204 and collect the new logical-to-physical address mapping table into the collection and update area H2F_M_A. The microcontroller 220 is configured to perform an update of the new logical-to-physical address mapping table within the collection and update area H2F_M_A. When recording a logical address corresponding to an old logical-to-physical address mapping table that has appeared in the collection and update area H2F_M_A into the physical-to-logical address mapping table F2H, the microcontroller 220 does not access the flash memory 204 for the old logical-to-physical address mapping table again. The microcontroller 220 is configured to perform an update of the old logical-to-physical address mapping table within the collection and update area H2F_M_A. The logical-to-physical address mapping tables collected and updated in the collection and update area H2F_M_A are further retrieved by the microcontroller 220 to be written into the flash memory 204 for the update of the logical-to-physical address mapping relationship H2F.

According to the aforementioned techniques, the logical-to-physical address mapping tables corresponding to the frequently changed data are not redundantly downloaded and uploaded from and to the flash memory 204 over and over again. As for writing sequential data (with successive logical addresses) into the flash memory 204, the sequence of write logical addresses may correspond to the same logical-to-physical address mapping table. Thus, the requested logical-to-physical address mapping table is downloaded into the collection and update area H2F_M_A just once to be updated within the collection and update area H2F_M_A and finally uploaded back to the flash memory 204.

Figure 3:
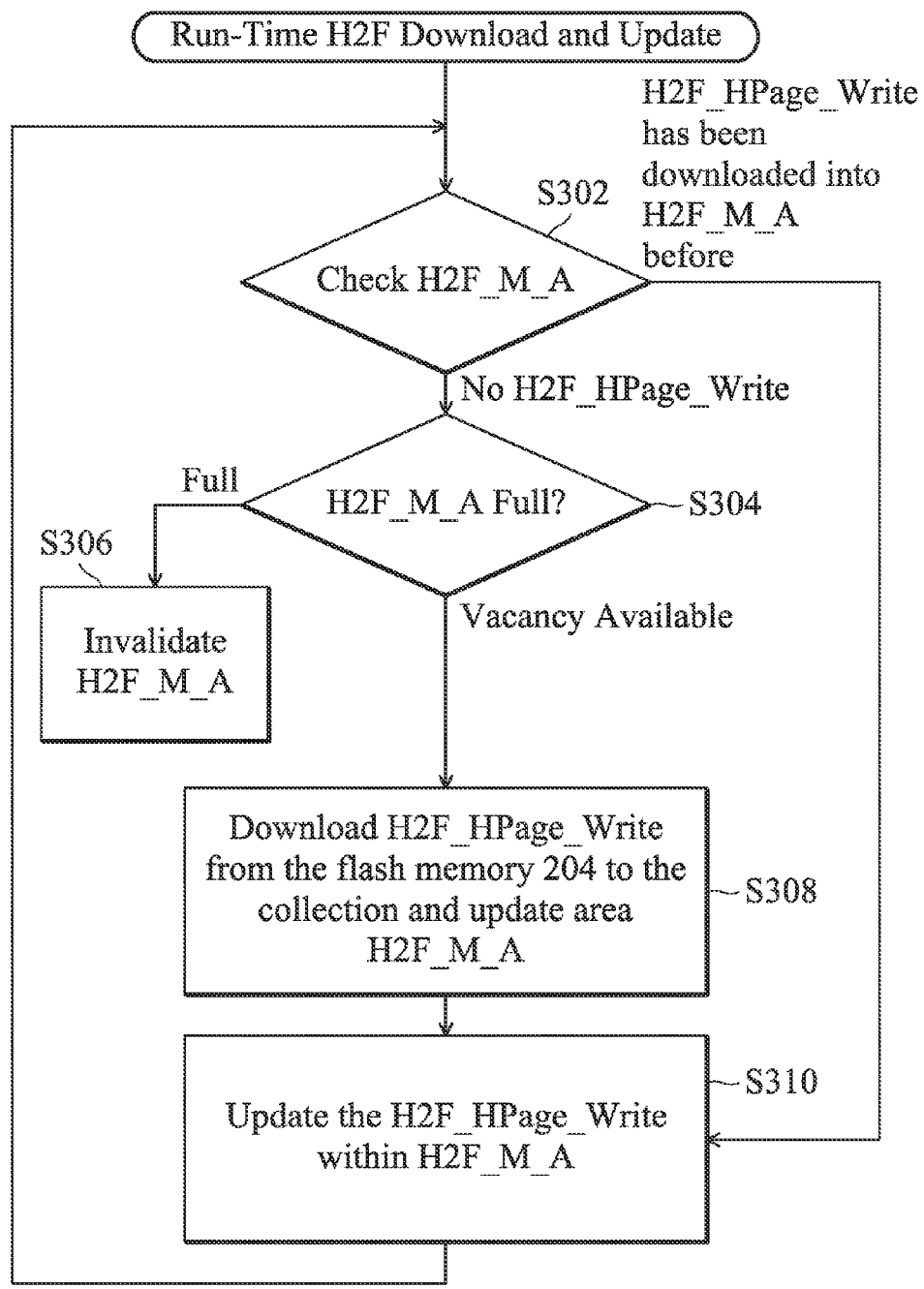
FIG. 3 is a flowchart depicting a run-time H2F download and update in accordance with an exemplary embodiment of the disclosure, wherein the write data is written into the run-time write block 214.

FIG. 3 is a flowchart depicting a run-time H2F download and update in accordance with an exemplary embodiment of the disclosure, wherein the write data is written into the run-time write block 214. In step S302, it is checked whether a logical-to-physical address mapping table H2F_HPage_Write corresponding to the logical write page HPage_Write has been stored in the collection and update area H2F_M_A before. If no, step S304 is performed to check whether there is a vacancy in the collection and update area H2F_M_A for the logical-to-physical address mapping table H2F_HPage_Write. When the collection and update area H2F_M_A is insufficient for the logical-to-physical address mapping table H2F_HPage_Write, step S306 is performed to invalidate the data in the collection and update area H2F_M_A. When the collection and update area H2F_M_A still has space for the logical-to-physical address mapping table H2F_HPage_Write, steps S308 and step S310 are performed to download the logical-to-physical address mapping table H2F_HPage_Write from the flash memory 204 to the collection and update area H2F_M_A and perform an update of the logical-to-physical address mapping table H2F_HPage_Write within the collection and update area H2F_M_A. Note that when it is determined in step S302 that the logical-to-physical address mapping table H2F_HPage_Write corresponding to the logical write page HPage_Write has been stored in the collection and update area H2F_M_A before, steps S304 and S308 are bypassed and step S310 is performed and an update of the logical-to-physical address mapping table HPage_Write that has been stored in the collection and update area H2F_M_A before is performed within the collection and update area H2F_M_A.

Figure 4:
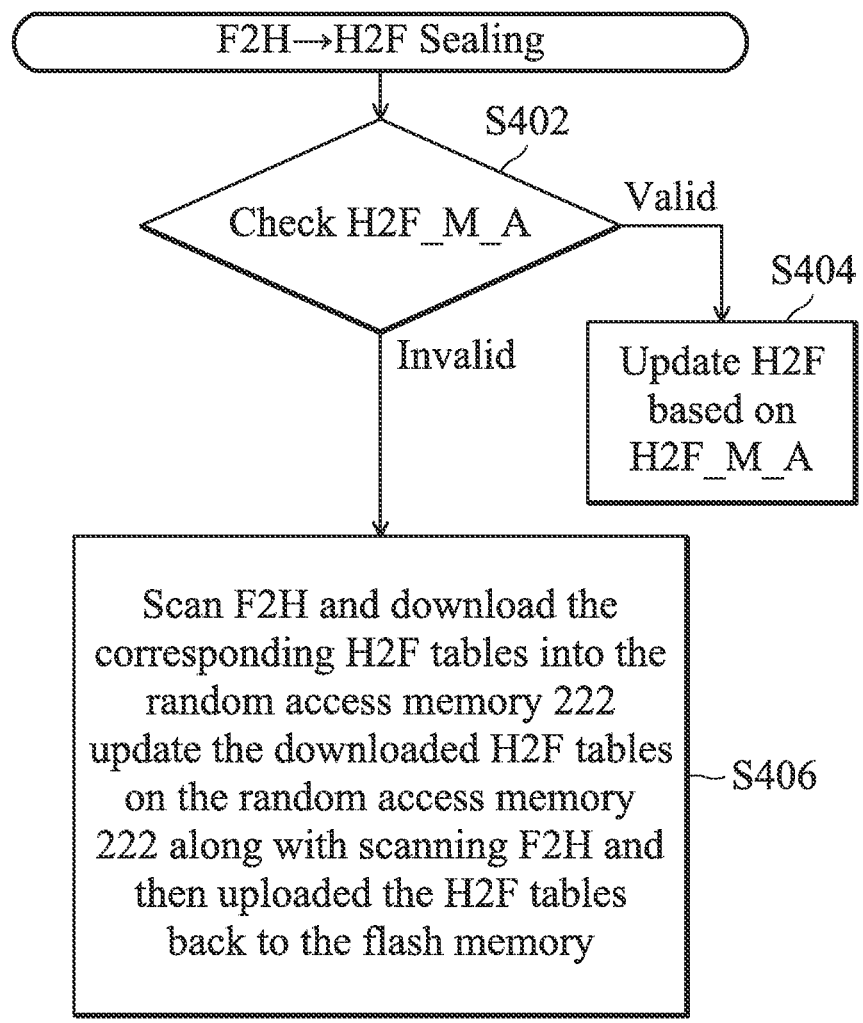
FIG. 4 is a flowchart depicting how to update the logical-to-physical address mapping relationship H2F.

FIG. 4 is a flowchart depicting how to update the logical-to-physical address mapping relationship H2F. In step S402, the collection and update area H2F_M_A is checked. When the data in the collection and update area H2F_M_A is valid, step S404 is performed and the logical-to-physical address mapping tables collected and updated in the collection and update area H2F_M_A are uploaded to the flash memory 204 to update the logical-to-physical address mapping relationship H2F. When the data in the collection and update area H2F_M_A is invalid, it means that the data in the collection and update area H2F_M_A has to be discarded and step S406 is performed. In step S406, the physical-to-logical address mapping table F2H is scanned to download all logical-to-physical address mapping tables that correspond to the logical addresses recorded in the physical-to-logical address mapping table F2H from the flash memory 204 to the random access memory 222. The logical-to-physical address mapping tables downloaded into the random access memory 222 along with scanning the physical-to-logical address mapping table F2H are updated on the random access memory 222 and then uploaded back to the flash memory 204.

Any technique using the aforementioned concept to control a flash memory is within the scope of the invention. The invention further involves flash memory control methods, which are not limited to any specific controller architecture.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, providing a storage space that is divided into a plurality of blocks with each block comprising a plurality of physical pages; and
a control unit, coupling the flash memory to a host and comprising a microcontroller and a random access memory,
wherein:
the microcontroller is configured to build a physical-to-logical address mapping table in the random access memory for a run-time write block between the blocks of the flash memory;
the microcontroller is further configured to allocate the random access memory to provide a collection and update area for logical-to-physical address mapping tables that correspond to logical addresses recorded into the physical-to-logical address mapping table; and
when recording a logical address corresponding to a new logical-to-physical address mapping table that has not appeared in the collection and update area into the physical-to-logical address mapping table, the microcontroller is further configured to collect the new logical-to-physical address mapping table into the collection and update area and perform an update of the new logical-to-physical address mapping table within the collection and update area.

2. The data storage device as claimed in claim 1, wherein:
when recording a logical address corresponding to an old logical-to-physical address mapping table that has appeared in the collection and update area into the physical-to-logical address mapping table, the microcontroller is further configured to perform an update of the old logical-to-physical address mapping table within the collection and update area.

3. The data storage device as claimed in claim 2, wherein:
the microcontroller is configured to update a logical-to-physical address mapping relationship recorded in the flash memory in accordance with the logical-to-physical address mapping tables collected and updated in the collection and update area.

4. The data storage device as claimed in claim 2, wherein:
the microcontroller is configured to invalidate the collection and update area when the collection and update area is insufficient for the logical-to-physical address mapping tables corresponding to logical addresses recorded in the physical-to-logical address mapping table.

5. The data storage device as claimed in claim 4, wherein:
the microcontroller is configured to upload the logical-to-physical address mapping tables collected and updated in the collection and update area to the flash memory to update a logical-to-physical address mapping relationship recorded in the flash memory when the collection and update area is not invalid.

6. The data storage device as claimed in claim 5, wherein:
the microcontroller is configured to discard data in the collection and update area when the collection and update area is invalid.

7. The data storage device as claimed in claim 6, wherein:
when the data in the collection and update area has been discarded, the microcontroller is configured to scan the physical-to-logical address mapping table to download logical-to-physical address mapping tables that correspond to the logical addresses recorded in the physical-to-logical address mapping table from the flash memory to the random access memory; and
the logical-to-physical address mapping tables downloaded into the random access memory along with scanning the physical-to-logical address mapping table are updated on the random access memory and then uploaded back to the flash memory.

8. A flash memory control method, comprising:
providing a random access memory for a flash memory, the flash memory providing a storage space that is divided into a plurality of blocks with each block comprising a plurality of pages;
building a physical-to-logical address mapping table in the random access memory for a run-time write block between the blocks of the flash memory; and
allocating the random access memory to provide a collection and update area for logical-to-physical address mapping tables that correspond to logical addresses recorded in the physical-to-logical address mapping table,
wherein when recording a logical address corresponding to a new logical-to-physical address mapping table that has not appeared in the collection and update area into the physical-to-logical address mapping table, the new logical-to-physical address mapping table is collected into the collection and update area and an update of the new logical-to-physical address mapping table is performed within the collection and update area.

9. The flash memory control method as claimed in claim 8, wherein:

when recording a logical address corresponding to an old logical-to-physical address mapping table that has appeared in the collection and update area into the physical-to-logical address mapping table, an update of the old logical-to-physical address mapping table is performed within the collection and update area.

10. The flash memory control method as claimed in claim 9, further comprising:

updating a logical-to-physical address mapping relationship recorded in the flash memory in accordance with the logical-to-physical address mapping tables collected and updated in the collection and update area.

11. The flash memory control method as claimed in claim 9, further comprising:

invalidating the collection and update area when the collection and update area is insufficient for the logical-to-physical address mapping tables corresponding to logical addresses recorded in the physical-to-logical address mapping table.

12. The flash memory control method as claimed in claim 11, further comprising:

uploading the logical-to-physical address mapping tables collected and updated in the collection and update area to the flash memory to update a logical-to-physical address mapping relationship recorded in the flash memory when the collection and update area is not invalid.

13. The flash memory control method as claimed in claim 12, further comprising:

discarding data in the collection and update area when the collection and update area is invalid.

14. The flash memory control method as claimed in claim 13, wherein:

when the data in the collection and update area has been discarded, the physical-to-logical address mapping table is scanned to download logical-to-physical address mapping tables that correspond to the logical addresses recorded in the physical-to-logical address mapping table from the flash memory to the random access memory; and the logical-to-physical address mapping tables downloaded into the random access memory along with scanning the physical-to-logical address mapping table are updated on the random access memory and then uploaded back to the flash memory.

* * * * *